US010163502B2

(12) United States Patent
Connor et al.

(10) Patent No.: US 10,163,502 B2
(45) Date of Patent: Dec. 25, 2018

(54) SELECTIVE PERFORMANCE LEVEL MODES OF OPERATION IN A NON-VOLATILE MEMORY

(71) Applicant: INTEL CORPORATION, Santa Clara, CA (US)

(72) Inventors: Christopher F. Connor, Hillsboro, OR (US); Bruce Querbach, Hillsboro, OR (US); Hanmant P. Belgal, El Dorado Hills, CA (US)

(73) Assignee: INTEL CORPORATION, Santa Clara, CA (US)

( * ) Notice: Subject to any disclaimer, the term of this patent is extended or adjusted under 35 U.S.C. 154(b) by 7 days.

(21) Appl. No.: 15/396,251

(22) Filed: Dec. 30, 2016

(65) Prior Publication Data

US 2018/0190350 A1 Jul. 5, 2018

(51) Int. Cl.
*G06F 3/06* (2006.01)
*G11C 13/00* (2006.01)

(52) U.S. Cl.
CPC .......... *G11C 13/004* (2013.01); *G06F 3/0611* (2013.01); *G06F 3/0634* (2013.01); *G06F 3/0679* (2013.01); *G11C 13/0004* (2013.01); *G11C 13/0033* (2013.01); *G11C 13/0038* (2013.01); *G11C 2013/0052* (2013.01)

(58) Field of Classification Search
CPC .............. G11C 13/004; G11C 13/0004; G11C 13/0033; G11C 13/0038; G11C 2013/0052; G06F 3/0611; G06F 3/0634; G06F 3/0679; G06F 3/0629; G06F 3/0659; G06F 3/0688; G06F 12/0238; G06F 12/0246
See application file for complete search history.

(56) References Cited

U.S. PATENT DOCUMENTS

| 5,297,029 | A | 3/1994 | Nakai et al. | |
|---|---|---|---|---|
| 6,047,352 | A | 4/2000 | Lakhani et al. | |
| 6,442,068 | B1 | 8/2002 | Bartoli et al. | |
| 6,442,076 | B1 | 8/2002 | Roohparvar | |
| 9,734,885 | B1* | 8/2017 | Healy | G11C 11/1675 |
| 2005/0030814 | A1 | 2/2005 | Oh et al. | |
| 2008/0117663 | A1* | 5/2008 | Philipp | G11C 7/04 365/148 |
| 2011/0110151 | A1* | 5/2011 | Prejbeanu | B82Y 25/00 365/173 |
| 2011/0219203 | A1* | 9/2011 | Nurminen et al | G11C 7/04 711/165 |

(Continued)

OTHER PUBLICATIONS

Ofstedahl, What is STT-MRAM, EE Times, Aug. 2014 (Year: 2014).*

(Continued)

*Primary Examiner* — Michael Krofcheck
(74) *Attorney, Agent, or Firm* — Konrad Raynes Davda & Victor LLP (57) ABSTRACT

In one embodiment, a non-volatile memory is controlled in a selectable read mode in response to commands from a processor. Selectable read modes may include a default read memory mode, for example, and a performance read memory mode having a shorter read pulse and a reduced read latency than the default read memory mode, for example. In one embodiment, the performance read memory mode may also have refresh operations at an increased frequency compared to that of the default read mode. Other aspects and advantages are described.

22 Claims, 5 Drawing Sheets

(56) References Cited

U.S. PATENT DOCUMENTS

| | | | | |
|---|---|---|---|---|
| 2013/0003451 | A1* | 1/2013 | Bedeschi | G11C 16/3418 |
| | | | | 365/163 |
| 2014/0247077 | A1* | 9/2014 | Singh | H03K 3/037 |
| | | | | 327/199 |
| 2015/0206568 | A1* | 7/2015 | Bose | G11C 11/1675 |
| | | | | 365/158 |
| 2015/0206569 | A1* | 7/2015 | Bose | A61H 3/00 |
| | | | | 365/158 |

OTHER PUBLICATIONS

Del Bel et al., Improving STT-MRAM Density Through Multibit Error Correction, 2014 (Year: 2014).*

U.S. Appl. No. 15/197,124, entitled "Methods and Apparatus to Reduce Threshold Voltage Drift", invented by D. Mantegazza et al., filed Jun. 29, 2016, 72 pp.

Clarke, P., "Patent Search Supports View 3D XPoint Based on Phase-Change", EE Times, [online], Jul. 31, 2015, [Retrieved on Dec. 30, 2015], Retrieved from the Internet at <URL: http://www.eetimes.com/author.asp?section_id=36&doc_id=1327313>, 5 pp.

Hruska, J., "Intel, Micron reveal Xpoint, a New Memory Architecture that Could Outclass DDR4 and NAND", Extreme Tech, [online], Jul. 28, 2015, [Retrieved on Dec. 30, 2016], Retrieved from the Internet at <URL: http://www.extremetech.com/extreme/211087-intel-micron-reveal-xpoint-a-new-memory-architecture-that-claims-to-outclass-both-ddr4-and-nand>, 9 pp.

Mearian, L., "These Technologies Will Blow the Lid Off Data Storage", Computer World, May 9, 2016, 13 pp.

Wikipedia, 3D XPoint, [online], Last Modified Nov. 15, 2016, [Retrieved on Nov. 19, 2016], Retrieved rom the Internet at <URL: https://en.wikipedia.org/wiki/3D_XPoint>, 3 pp.

Wikipedia, Phase-Change Memory, [online], Last Modified Sep. 3, 2016, [Retrieved on Nov. 19, 2016], Retrieved from the Internet at <URL: https://en.wikipedia.org/wiki/Phase-change_memory>, 9 pp.

International Search Report and Written Opinion for International Application No. PCT/US2017/066546, dated Apr. 9, 2018, 10 pp. [77.372 (ISR & WO)].

* cited by examiner

FIG. 1

| Memory Mode | Read Pulse Width | Overall Read Delay | Refresh Rate |
|---|---|---|---|
| Default Read Memory Mode | Default Width1 | Default Read Delay1 | Default Rate1 |
| Performance Read Memory Mode | Reduced Width2 | Reduced Read Delay2 | Increased Rate2 |

SELECTIVE PERFORMANCE LEVEL MODES OF OPERATION IN A NON-VOLATILE MEMORY

TECHNICAL FIELD

Certain embodiments of the present description relate generally to management of memory resources.

BACKGROUND

A non-volatile memory capable of storing a large amount of data frequently has drawbacks such slower input/output speeds as compared to volatile, smaller capacity memories. Conversely, smaller, volatile memories which may be faster to operate, may have a greater cost to store data on a per bit basis, as compared to larger capacity non-volatile memories. Further, data stored in a volatile memory may be lost in the event of a loss of power or a system reset. Accordingly, computer systems may employ a non-volatile memory notwithstanding lower performance as compared to faster volatile memory.

BRIEF DESCRIPTION OF THE DRAWINGS

Embodiments of the present disclosure are illustrated by way of example, and not by way of limitation, in the figures of the accompanying drawings in which like reference numerals refer to similar elements.

DESCRIPTION OF EMBODIMENTS

In the description that follows, like components have been given the same reference numerals, regardless of whether they are shown in different embodiments. To illustrate one or more embodiments of the present disclosure in a clear and concise manner, the drawings may not necessarily be to scale and certain features may be shown in somewhat schematic form. Features that are described or illustrated with respect to one embodiment may be used in the same way or in a similar way in one or more other embodiments or in combination with or instead of features of other embodiments.

A non-volatile memory employing selective performance level modes of non-volatile memory operation in accordance with the present description can improve levels of performance as compared to those achieved by many prior non-volatile memories. One measure of non-volatile memory performance is read latency which is typically related to timing behavior within a bitcell being read and inherent circuit and routing delays from the time a read address is presented and the read data is obtained. Other factors may also contribute to the overall delay from one non-volatile memory read operation to the next non-volatile memory read operation.

One general aspect of selective performance level modes of non-volatile memory operation in accordance with the present description includes controlling a non-volatile memory in a selectable read mode in response to commands from a processor. Accordingly, a non-volatile memory mode may be selected from a plurality of non-volatile memory modes including a first non-volatile memory mode which may be a default read non-volatile memory mode, for example, and a second non-volatile memory mode which may be a performance read non-volatile memory mode, for example, having a lower read latency than the default read non-volatile memory mode.

In one aspect of the present description, it is appreciated that in various types of non-volatile memory, read latency may be reduced by reducing the width of the read pulse applied to a bitcell. Accordingly, in one embodiment, a read pulse width may be selected from a plurality of widths in association with the selected non-volatile memory mode. For example, the default read non-volatile memory mode may have a default level read pulse width having a default level read latency in the default read non-volatile memory mode. Alternatively, a second, performance level read pulse width having a second, performance level read latency in the performance read non-volatile memory mode, may be selected where the performance level read pulse width is shorter than the default read pulse width, and the performance level read latency is shorter than the default level read latency.

In a read operation in a selected read non-volatile memory mode, a read pulse having a selected read pulse width, may be applied to a bitcell of the non-volatile memory, to read a non-volatile memory state stored in the bitcell. Accordingly, the latency levels of the read operations may be reduced or lengthened in accordance with the selected read non-volatile memory mode and the associated read pulse width of the selected read non-volatile memory mode. Similarly, the latency levels of the read operations may be reduced or lengthened in accordance with the selected read pulse width associated with a read non-volatile memory mode. In this manner, read latency of the non-volatile memory may be dynamically adjusted to optimize or otherwise improve the performance of the non-volatile memory.

Selective performance level modes of non-volatile memory operation in accordance with the present description permit byte-addressable non-volatile memory, such as phase change memory, to be used in a wide array of applications.

In another aspect of the present description, it is appreciated that the level of persistence exhibited by a non-volatile memory, such as a phase change non-volatile memory, for example, may vary as a function of the selected read pulse width or the selected read non-volatile memory mode. For example, selecting a performance level read pulse width may reduce the persistence of the non-volatile memory states stored in the bitcells of the non-volatile memory.

Figure 1:
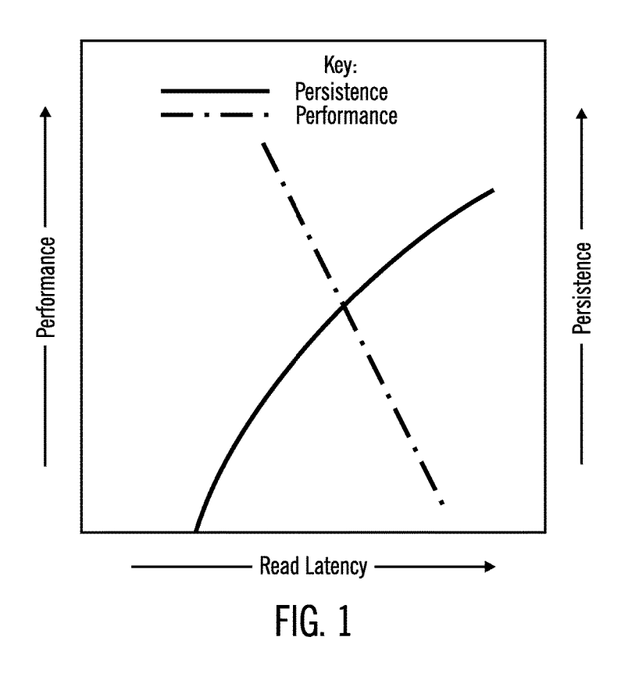
FIG. 1 is a chart depicting a trade-off between performance and non-volatile memory persistence in a system employing selective performance level modes of non-volatile memory operation in accordance with the present description.

FIG. 1 is a chart depicting an example of trade-off between performance and non-volatile memory persistence in a system employing selective performance level modes of non-volatile memory operation in accordance with one embodiment of the present description. In the example of FIG. 1, performance is a function of read latency which is in turn a function of the net sum of circuit delay plus read pulse width. Circuit delay is assumed to be fixed in this example for simplification purposes. In one aspect of the present description, an improvement in non-volatile memory performance may be achieved in a performance read non-volatile memory operation by a direct reduction of non-volatile memory persistence by reducing read pulse width. Accordingly, as depicted in FIG. 1, the greater the reduction in read pulse width, hence the greater the reduction in read latency, the greater the improvement in non-volatile memory performance with a corresponding decrease in non-volatile memory persistence. Such a decrease in non-volatile memory persistence may be compensated by a corresponding increase in refresh rate of the non-volatile memory to preserve bit states of the bitcells. Refresh is performed in a non-volatile memory to avoid losses in data integrity which may occur over time due to temperature and cell behavior. For example losses in data integrity may occur over periods of time such as over 2 days at 85 degrees Celsius (C). In refresh operations applied to a non-volatile memory, the non-volatile memory is scrubbed which includes reading all memory addresses and writing the data read from each memory address back to that memory address. In this manner, data integrity in a non-volatile memory may be preserved over relatively long periods of time at relatively high temperatures by providing a refresh operation at an appropriate rate. In one embodiment, a refresh rate from a plurality of refresh rates may be automatically selected as a function of one of the selected non-volatile memory mode and the selected read pulse width. For example, the plurality of refresh rates may include a default level refresh rate at a default level frequency of refresh operations which is automatically selected in the default non-volatile memory mode. A second performance level refresh rate at a performance level frequency may be automatically selected in the performance read non-volatile memory mode where the frequency of the performance level refresh rate is more frequent than the frequency of the default level refresh rate. For example, the frequency of refresh operations of the performance level refresh rate may be within a range of 10 to 100 times more frequent than the frequency of default level of refresh operations. In this manner, refresh rates may be dynamically adjusted to optimize or otherwise improve the reliability of the non-volatile memory while also improving performance.

It is appreciated that in some applications, persistence of the non-volatile memory may not be needed in a performance read operation mode having enhanced performance. For example, a non-volatile memory may be treated as a volatile memory during operation in a performance read operation mode. Accordingly, refresh operations may be increased, reduced or eliminated in some performance read operation modes, depending upon the particular application.

In another aspect of the present description, various parameters of selective performance level modes of non-volatile memory operation in accordance with the present description may be programmable. For example, a non-volatile memory mode command from a processor may include a variable read pulse width value. In response to a received read pulse width command, the width of a read pulse may be programmed as a function of the received read pulse width value to provide a programmable read pulse width so that one or more non-volatile memory modes are programmable non-volatile memory modes in which read latency in each programmable non-volatile memory mode is programmable, as a function of a programmable read pulse width.

In another example, a refresh rate command from the processor, includes a variable refresh rate value. In response to the received refresh rate command, a refresh rate may be programmed as a function of the received refresh rate value so that one or more non-volatile memory modes are programmable non-volatile memory modes in which persistence level in each programmable non-volatile memory mode is a function of a programmable read pulse width.

The various parameters of selective performance level modes of non-volatile memory operation in accordance with the present description may programmed at the time of manufacture of the non-volatile memory controller or other device employing selective performance level modes of non-volatile memory operation. For example, a mode of operation, a pulse width, and/or a refresh rate may be selected by setting one or more hardware fuses on the device. Also, in some embodiments, system users and applications running on the system may be provided a capability of programming one or more parameters of selective performance level modes of non-volatile memory operation in accordance with the present description in real time while the system is in use.

Implementations of the described techniques may include hardware, a method or process, or computer software on a computer-accessible medium. Thus, embodiments include corresponding computer systems, apparatus, and computer programs recorded on one or more computer storage devices, each configured to perform the actions of the methods.

A non-volatile memory interface employing selective performance level modes of non-volatile memory operation in accordance with the present description is described herein in connection with sectors of data, blocks of sectors and regions of blocks. However, it is appreciated that a non-volatile memory interface in accordance with the present description may be applied to other units and subunits of data such as volumes, tracks, segments, files, bytes, etc.

A non-volatile memory interface having selective performance level modes of non-volatile memory operation in accordance with the present description may, in one embodiment, be employed in a system of one or more computers configured to perform particular operations or actions of selective non-volatile memory mode authorization enforcement, by virtue of having software, firmware, hardware, or a combination of them installed on the system that in operation causes or cause the system to perform the actions. One or more computer programs can be configured to perform particular operations or actions of selective non-volatile memory mode authorization enforcement, by virtue of including instructions that, when executed by data processing apparatus, cause the apparatus to perform the actions.

Other embodiments include corresponding computer systems, apparatus, and computer programs recorded on one or more computer storage devices, each configured to perform the actions of the methods. Implementations of the described techniques may include hardware, a method or process, or computer software on a computer-accessible medium.

Thus, the operations described herein are performed by logic which is configured to perform the operations either automatically or substantially automatically with little or no system operator intervention, except where indicated as being performed manually such as user selection. Thus, as used herein, the term "automatic" includes both fully automatic, that is operations performed by one or more hardware or software controlled machines with no human intervention such as user inputs to a graphical user selection interface. As used herein, the term "automatic" further includes predominantly automatic, that is, most of the operations (such as greater than 50%, for example) are performed by one or more hardware or software controlled machines with no human intervention such as user inputs to a graphical user selection interface, and the remainder of the operations (less than 50%, for example) are performed manually, that is, the manual operations are performed by one or more hardware or software controlled machines with human intervention such as user inputs to a graphical user selection interface to direct the performance of the operations.

Many of the functional elements described in this specification have been labeled as "logic," in order to more particularly emphasize their implementation independence. For example, a logic element may be implemented as a hardware circuit comprising custom VLSI circuits or gate arrays, off-the-shelf semiconductors such as logic chips, transistors, or other discrete components. A logic element may also be implemented in programmable hardware devices such as field programmable gate arrays, programmable array logic, programmable logic devices or the like.

A logic element may also be implemented in software for execution by various types of processors. A logic element which includes executable code may, for instance, comprise one or more physical or logical blocks of computer instructions which may, for instance, be organized as an object, procedure, or function. Nevertheless, the executables of an identified logic element need not be physically located together, but may comprise disparate instructions stored in different locations which, when joined logically together, comprise the logic element and achieve the stated purpose for the logic element.

Indeed, executable code for a logic element may be a single instruction, or many instructions, and may even be distributed over several different code segments, among different programs, among different processors, and across several non-volatile memory devices. Similarly, operational data may be identified and illustrated herein within logic elements, and may be embodied in any suitable form and organized within any suitable type of data structure. The operational data may be collected as a single data set, or may be distributed over different locations including over different storage devices.

Figure 2:
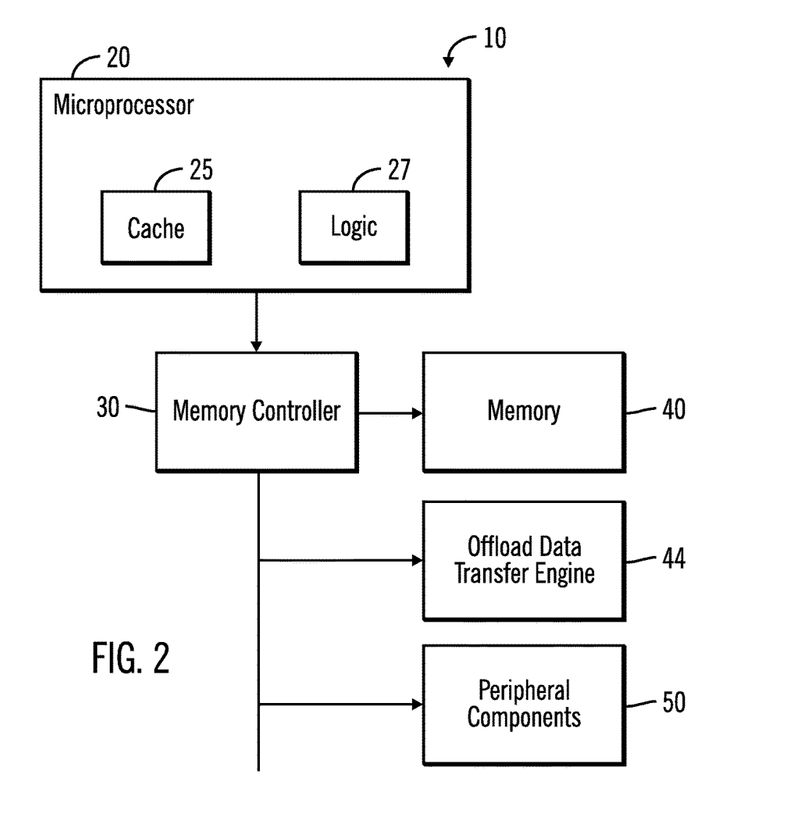
FIG. 2 depicts a high-level block diagram illustrating one embodiment of a system employing selective performance level modes of non-volatile memory operation in accordance with the present description.

FIG. 2 is a high-level block diagram illustrating selected aspects of a computing system implemented according to an embodiment of the present disclosure. System 10 may represent any of a number of electronic or other computing devices, that may include a non-volatile memory device. Such electronic devices may include a cloud storage system and other computing devices such as a mainframe, server, personal computer, workstation, telephony device, network appliance, virtualization device, storage controller, portable or mobile devices (e.g., laptops, netbooks, tablet computers, personal digital assistant (PDAs), portable media players, portable gaming devices, digital cameras, mobile phones, smartphones, feature phones, etc.) or component (e.g. system on a chip, processor, bridge, memory controller, memory, etc.). System 10 can be powered by a battery, renewable power source (e.g., solar panel), wireless charging, or by use of an AC outlet.

In alternative embodiments, system 10 may include more elements, fewer elements, and/or different elements. Moreover, although system 10 may be depicted as comprising separate elements, it will be appreciated that such elements may be integrated on to one platform, such as systems on a chip (SoCs). In the illustrative example, system 10 comprises a central processing unit or microprocessor 20, a memory controller 30, a memory 40, an offload data transfer engine 44, and peripheral components 50 which may include, for example, video controller, input device, output device, storage, network adapter or interface, a power source (including a battery, renewable power source (e.g., photovoltaic panel), wireless charging, or coupling to an AC outlet), etc.

The microprocessor 20 includes a cache 25 that may be part of a memory hierarchy to store instructions and data, and the system memory 40 may also be part of the memory hierarchy. The microprocessor 20 further includes logic 27 which may include one or more cores, and may include a system agent, for example. A core typically contains the components of the processor involved in executing instructions, such as an arithmetic logic unit (ALU), floating point unit (FPU), and/or various levels of cache (such as L1 and L2 cache), for example. A system agent may include various controllers such as serial or parallel data path controllers, various levels of cache (such as L3 cache) a snoop agent pipeline an on-die memory controller, and/or other logic.

Communication between the microprocessor 20 and the memory 40 may be facilitated by a memory controller (or chipset) 30, which may also facilitate in communicating with the peripheral components 50. The memory controller 30 may be on-die with a component such as a microprocessor 20, an offload engine 44, a memory of the memory 40, or a component of the peripheral components 50, for example, or may be separate.

Peripheral components 50 which are storage devices may be, for example, non-volatile storage, such as solid-state drives (SSD), magnetic disk drives including redundant arrays of independent disks (RAID), optical disk drives, a tape drive, flash memory, etc. The storage may comprise an internal storage device or an attached or network accessible storage. The microprocessor 20 is configured to write data in and read data from the memory 40. Programs in the storage are loaded into the memory and executed by the processor. The offload data transfer engine 44 facilitates memory to memory data transfers which bypass the microprocessor to lessen the load of such transfers on the microprocessor 20. As explained in greater detail below, one embodiment of a non-volatile memory interface having selective performance level modes of non-volatile memory operation in accordance with the present description, can provide a suitable level of performance as appropriate for a particular application.

A network controller or adapter enables communication with a network, such as an Ethernet, a Fiber Channel Arbitrated Loop, etc. Further, the architecture may, in certain embodiments, include a video controller configured to display information represented by data in a memory on a display monitor, where the video controller may be embodied on a video card or integrated on integrated circuit components mounted on a motherboard or other substrate. An input device is used to provide user input to the processor, and may include a keyboard, mouse, pen-stylus, microphone, touch sensitive display screen, input pins, sockets, or any other activation or input mechanism known in the art. An output device is capable of rendering information transmitted from the processor, or other component, such as a display monitor, printer, storage, output pins, sockets, etc. The network adapter may embodied on a network card, such as a Peripheral Component Interconnect (PCI) card, PCI-express, or some other I/O card, or on integrated circuit components mounted on a motherboard or other substrate. The peripheral devices 50 may also include RF receiver/transmitters such as in a mobile telephone embodiment, for example. Additional examples of peripheral devices 50 which may be provided in the system include an audio device and temperature sensor to deliver temperature updates for storage in the memory.

One or more of the components of the device 10 may be omitted, depending upon the particular application. For example, a network router may lack a video controller, for example.

Any one or more of the memory devices 25, 40, and the other devices 10, 30, 50 may include a non-volatile memory employing a non-volatile memory interface having selective performance level modes of non-volatile memory operation in accordance with the present description, or be embodied as any type of data storage capable of storing data in a persistent manner (even if power is interrupted to non-volatile memory) such as but not limited to any combination of memory devices that use for example, chalcogenide phase change material (e.g., chalcogenide glass), 3D crosspoint memory, or other types of byte-addressable, write-in-place non-volatile memory, ferroelectric transistor random-access memory (FeTRAM), nanowire-based non-volatile memory, phase change memory (PCM), phase change memory with switch (PCMS), memory that incorporates memristor technology, Magnetoresistive random-access memory (MRAM) or another Spin Transfer Torque (STT)-MRAM as described above. Such memory elements in accordance with embodiments described herein can be used either in stand-alone memory circuits or logic arrays, or can be embedded in microprocessors and/or digital signal processors (DSPs). Additionally, it is noted that although systems and processes are described herein primarily with reference to microprocessor based systems in the illustrative examples, it will be appreciated that in view of the disclosure herein, certain aspects, architectures, and principles of the disclosure are equally applicable to other types of device memory and logic devices.

Figure 3A:
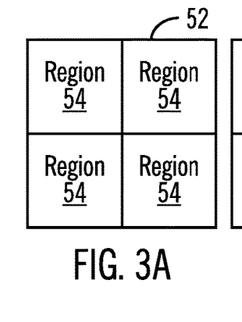
FIGS. 3a-3d depict various hierarchical levels of data storage of the non-volatile memory of FIG. 2.
Figure 3B:
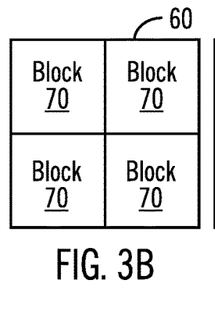

One or more of the memory 40 and storage devices of the peripheral devices 50 may have a rectangular or orthogonal array of rows and columns of cells such as bit cells in which each bit cell is configured to store a bit state. An array of bit cells may be logically subdivided in an array 52 of regions 54 (FIG. 3a). Depending upon the size of the memory, the array of bit cells may have tens, hundreds, thousands, or more of such regions 54. A region 54 may be logically subdivided in an array 60 of blocks 70 (FIG. 3b). Depending upon the size of the memory, the array of blocks may have tens, hundreds, thousands, or more of such blocks 70. In one embodiment, the memory 40 or storage device of the devices 50 may include a non-volatile memory such as a flash memory, for example, in which each block 70 represents the smallest subunit of the memory which may be erased at one time.

Figure 3C:
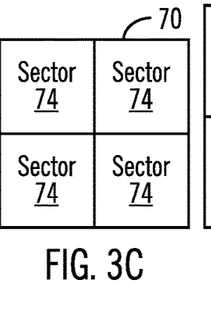
Figure 3D:
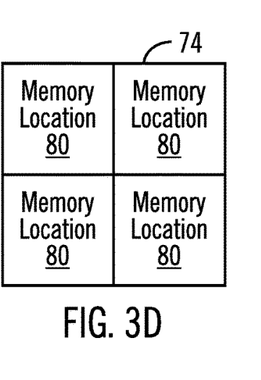

Each block 70 may in turn be subdivided into an array of sectors 74 (FIG. 3c). Depending upon the size of the memory, a block 70 of sectors 74 may have a single sector or tens, hundreds, thousands, or more of such sectors 74. Each sector 74 may in turn be subdivided into an array of memory locations 80 (FIG. 3d). Depending upon the size of the memory, a sector 74 of memory locations 80 may have tens, hundreds, thousands, or more of such memory locations 80. One specific example of a sector is sized sufficiently to store 512 bytes of data. Each memory location includes one or more bit cells to store a bit, a byte, a word or other subunit of data, depending upon the particular application. Although a memory interface in accordance with the present description is described in connection with storing data in a block of one or more sectors, it is appreciated that other units of data storage such as pages, tracks, segments, files, volumes, disks, drives, etc., may be utilized, depending upon the particular application.

Figure 4:
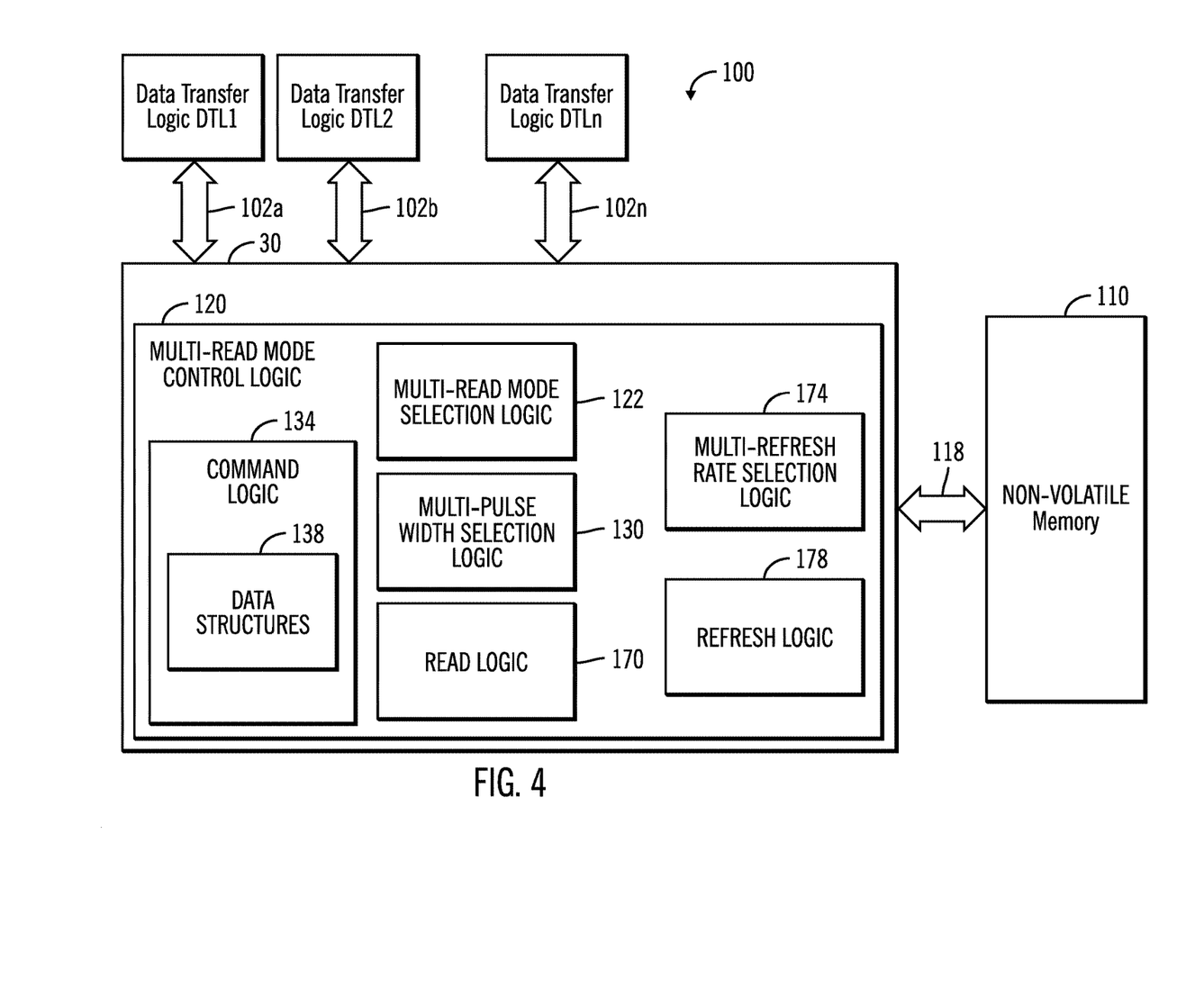
FIG. 4 depicts an embodiment of a non-volatile memory interface employing selective performance level modes of non-volatile memory operation in accordance with the present description.

FIG. 4 is a high-level block diagram illustrating selected aspects of another embodiment of a computing system implementing a non-volatile memory interface 100 in accordance with the present description. In this embodiment, the computing system includes a plurality of data transfer logic elements, DTL1, DTL2, DTLn, each of which may include a central processing unit, an offload data transfer engine, or other local or remote data transfer logic. Each data transfer logic such as the data transfer logic DTL1, for example, is configured to generate and transmit over an appropriate parallel or serial bus or other data path 102a, 102b, . . . 102n, to a non-volatile memory 110 of the interface 100, a non-volatile memory transaction request such as a read command or a write command, and an address such as a system memory address at which the memory transaction is to take place.

The non-volatile memory interface 100 provides an interface between the plurality of data transfer logic elements, DTL1, DTL2, . . . DTLn, and of one or more volatile and non-volatile memories. For example, volatile memory is a storage medium that requires power to maintain the state of data stored by the medium. Examples of volatile memory may include various types of random access memory (RAM), such as dynamic random access memory (DRAM) or static random access memory (SRAM). One particular type of DRAM that may be used in a memory module is synchronous dynamic random access memory (SDRAM). Conversely, non-volatile memory is a storage medium that does not require power to maintain the state of data stored by the medium. In the illustrated embodiment, the non-volatile memory 110 represents a phase change type non-volatile memory. However, it is appreciated that selective performance level modes of memory operation in accordance with the present description may be employed with a variety of host, storage and other memory devices such as for example, solid state memory devices that use chalcogenide phase change material (e.g., chalcogenide glass), three-dimensional (3D) crosspoint memory, or memory that incorporates memristor technology. Additional memory devices which could benefit from a memory interface having selective performance level modes of memory operation in accordance with the present description may include other types of byte-addressable, write-in-place non-volatile memory, ferroelectric transistor random-access memory (FeTRAM), nanowire-based non-volatile memory, Magnetoresistive random-access memory (MRAM), Spin Transfer Torque (STT)-MRAM, Phase Change Memory (PCM), storage class memory (SCM), universal memory, Ge2Sb2Te5, programmable metallization cell (PMC), resistive memory (RRAM), RESET (amorphous) cell, SET (crystalline) cell, PCME, Ovshinsky memory, ferroelectric memory (also known as polymer memory and poly(N-vinylcarbazole)), ferromagnetic memory (also known as Spintronics, SPRAM (spin-transfer torque RAM)), STRAM (spin tunneling RAM), magnetic memory, magnetic random access memory (MRAM), and Semiconductor-oxide-nitride-oxidesemiconductor (SONOS, also known as dielectric memory). It is appreciated that other types of memory may benefit from a memory interface having selective performance level modes of memory operation in accordance with the present description, depending upon the particular application.

A non-volatile memory controller 30 of the interface 100 is configured to control input and output operations to and from a non-volatile memory 110 which includes an array of bitcells. Accordingly, the non-volatile memory controller 30 is configured to perform in response to a non-volatile memory transaction request and a system address from a data transfer logic elements, DTL1, DTL2, DTLn, a non-volatile memory transaction such as a read operation or a write operation at a memory address of the non-volatile memory 110 as a function of the received system address.

The non-volatile memory controller 30 is coupled to the non-volatile memory 110 by an appropriate parallel or serial bus or other data path 118. For example, the data path 118 may be a bus in which non-volatile memory transaction requests, memory addresses, error messages and other data are transmitted in accordance with a suitable transactional protocol. It is appreciated that the hardware aspects and transmission protocols of the data paths 102a, 102b, . . . 102n, 118 may vary, depending upon the particular application.

The non-volatile memory controller 30 includes a multi-read mode control logic 120 which is configured to provide selective performance level modes of non-volatile memory operation in accordance with the present description. Thus, in one embodiment, the multi-read mode control logic 120 may be implemented in one or more non-volatile memory controllers such as the non-volatile memory controller 30. In other embodiments, the multi-read mode control logic 120 may be implemented as separate devices or integrated with central processing units, offload data transfer engines, memory devices, etc.

Figure 5:
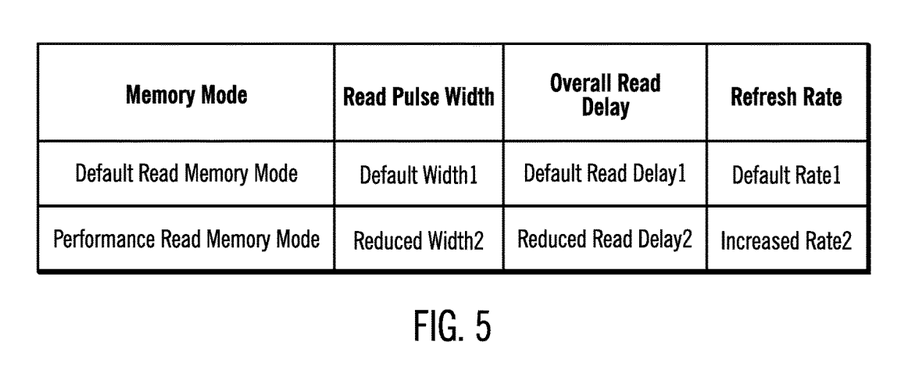
FIG. 5 is a chart depicting an example of selective performance level modes of non-volatile memory operation in accordance with the present description.

In one aspect of the present description, the multi-read mode control logic 120 of the non-volatile memory interface 100 is configured to control the non-volatile memory 110 in a selectable read mode in response to non-volatile memory transaction requests such as commands from the processor. In one embodiment the multi-read mode control logic 120 includes multi-read mode selection logic 122 configured to select a non-volatile memory mode from a plurality of non-volatile memory modes including a first non-volatile memory mode such as a default read non-volatile memory mode having a default level of performance, and a second non-volatile memory mode such as a performance read non-volatile memory mode having a higher level of performance than the default read non-volatile memory mode. FIG. 5 is a chart depicting two such non-volatile memory modes, a default read non-volatile memory mode and a performance read non-volatile memory mode, for example. Although two selectable non-volatile memory modes are depicted in FIG. 5, it is appreciated that the multi-read mode selection logic 122 may be configured to select a non-volatile memory mode from more than two selectable non-volatile memory modes, depending upon the particular application.

Figure 6A:
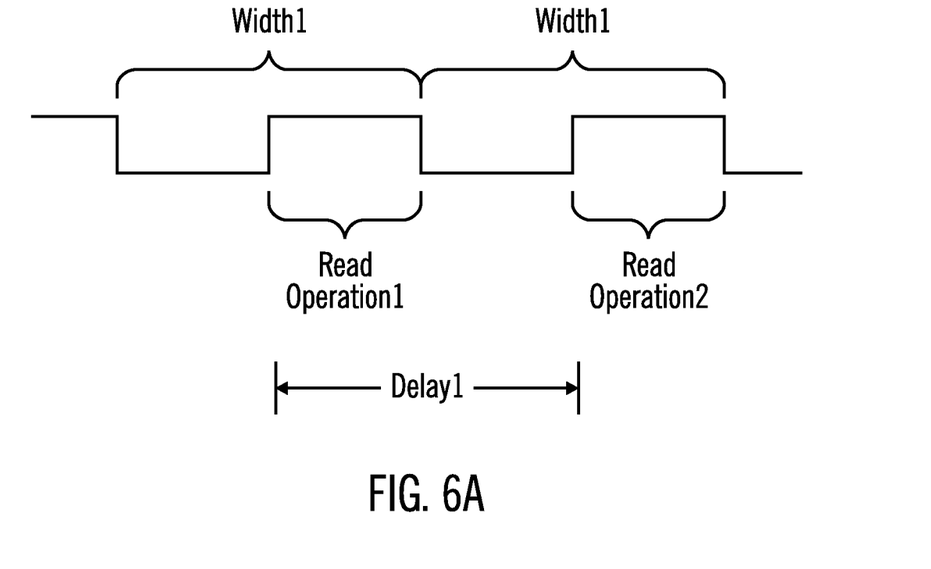
FIGS. 6a, 6b depict examples of read pulse widths associated with various non-volatile memory modes of operation of a non-volatile memory employing selective performance level modes of non-volatile memory operation in accordance with the present description.

The multi-read mode control logic 120 (FIG. 4) also includes multi-pulse width selection logic 130 configured to select a read pulse width from a plurality of widths in association with the selected non-volatile memory mode. FIG. 6a depicts one such selectable pulse width designated width1 for a read pulse. In this example, the read pulse width1 is the default level read pulse width and is associated with the default read non-volatile memory mode of FIG. 5.

As previously mentioned, read latency is typically related to timing behavior within a bitcell being read and inherent circuit and routing delays from the time a read address is presented and the read data is obtained. Other factors may also contribute to the overall delay from one non-volatile memory read operation to the next non-volatile memory read operation. In the example of FIG. 6a, a read pulse in the default read non-volatile memory mode has a default pulse width1 such that the non-volatile memory has a particular associated read latency in read operations in the default read non-volatile memory mode. The read latency associated with the default read non-volatile memory mode contributes to an overall read delay designated delay1 in FIGS. 4, 5a from one read operation, read operation1 (FIG. 6a), to the next read operation, read operation2. It is appreciated that the duty cycle of the read pulse may vary, depending upon the particular application.

Figure 6B:
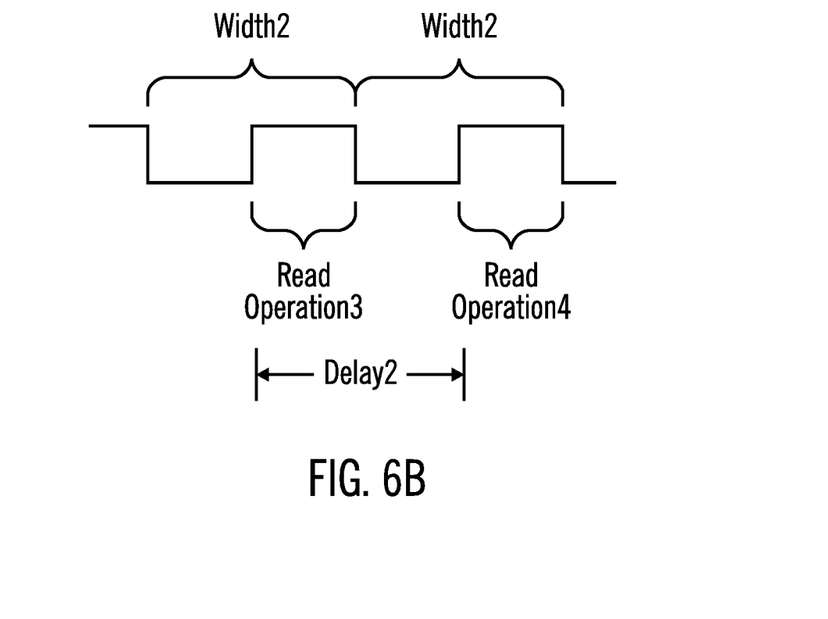

FIG. 6b depicts another example of a selectable pulse width designated width2 for a read pulse. In this example, the read pulse width2 is a performance level read pulse width and is associated with the performance read non-volatile memory mode of FIG. 5. In the example of FIGS. 4, 5b, a read pulse in the performance read non-volatile memory mode has a performance level pulse width2 which is shorter in duration than that of the default level pulse width1 of FIG. 6a. As a result, the non-volatile memory has an associated read latency in read operations in the performance read non-volatile memory mode which is shorter in duration than the read latency in read operations in the default read non-volatile memory mode. The shorter read latency associated with the performance read non-volatile memory mode contributes to a shorter overall delay designated delay2 in FIGS. 4, 5b from one read operation, read operation3 (FIG. 6b), to the next read operation, read operation4 in the performance read non-volatile memory mode.

In one embodiment, the multi-read mode control logic 120 (FIG. 4) also includes command logic 134 configured to receive a command from a processor such as one of the data transfer logic DTL1, DTL2 . . . DTLn. Accordingly, the multi-read mode selection logic 122 is further configured to select a non-volatile memory mode in response to a command received by the command logic 134. In one embodiment, a command received by the command logic 134 may include a parameter which identifies a selected non-volatile memory mode, such as the default read non-volatile memory mode or the performance read non-volatile memory mode, for example. Thus, the multi-read mode selection logic 122 may be configured to select a non-volatile memory mode as identified by the non-volatile memory mode parameter accompanying a command received by the command logic 134. The non-volatile memory mode parameter identifying the selected non-volatile memory mode may be stored in a suitable data structure 138 of the command logic 134 in some embodiments.

In another aspect, the multi-pulse width selection logic 130 is configured to select a read pulse width. In one embodiment, the read pulse width may be selected automatically as a function of the selected read non-volatile memory mode. For example, the pulse width1 may be selected automatically in response to selection of the default read non-volatile memory mode. Similarly, the pulse width2 may be selected automatically in response to selection of the performance read non-volatile memory mode.

In another aspect, the multi-pulse width selection logic 130 is configured to select a read pulse width in response to a read pulse width command received by the command logic 134. Accordingly, in one embodiment, a command may include a parameter which identifies a selected read pulse width, such as the default level read pulse width1 or the performance level read pulse width2, for example. Thus, the multi-read mode selection logic 122 may be configured to select a read pulse width as identified by the read pulse width parameter accompanying a command received by the command logic 134. The read pulse width parameter identifying the selected read pulse width mode may be stored in a suitable data structure 138 of the command logic 134 in some embodiments.

In still another aspect, a command received by the command logic 134 may include a variable read pulse width value which quantifies a read pulse width. For example, the variable read pulse width value may be numerical in nature and identify a read pulse width as a function of the numerical value. For example, the identified read pulse width may be proportional to the magnitude of the variable read pulse width value.

The multi-pulse width selection logic 130 accordingly may be further configured to program the width of a read pulse as a function of the received read pulse width value to provide a programmable read pulse width. As a result, in one embodiment, the non-volatile memory modes may be programmable non-volatile memory modes in which read latency in each programmable non-volatile memory mode is programmable, as a function of a programmable read pulse width. The read pulse width value of a received command may be stored in a suitable data structure 138 of the command logic 134.

The multi-read mode control logic 120 (FIG. 4) also includes read logic 170 configured to apply in a read operation in a selected non-volatile memory mode, a read pulse having a selected read pulse width, to one or more bitcells of the non-volatile memory, to read the non-volatile memory states stored in the bitcells being addressed. It is appreciated that a non-volatile memory state in the performance read non-volatile memory mode may have a persistence level which is shorter in duration than the persistence level of a non-volatile memory state in the default read non-volatile memory mode due to the shorter duration pulse width of a read pulse in the performance read non-volatile memory mode as compared to that of a read pulse in the default read non-volatile memory mode.

Accordingly, in another aspect of the present description, the multi-read mode control logic 120 may also include multi-refresh rate selection logic 174 configured to select a refresh rate from a plurality of refresh rates as a function of various parameters such as the selected non-volatile memory mode or the selected read pulse width, for example. In one embodiment, the plurality of refresh rates include a first refresh rate, rate1 (FIG. 5) at a first frequency in the default read non-volatile memory mode, and a second refresh rate, rate2, at a second frequency in the performance read non-volatile memory mode where the frequency of the second refresh rate2 of the performance read non-volatile memory mode is more frequent than the frequency of the refresh rate1 of the default read non-volatile memory mode.

Refresh logic 178 of the multi-read mode control logic 120, is configured to apply in a selected non-volatile memory mode, non-volatile memory refresh operations to the non-volatile memory at a selected refresh rate of the selected non-volatile memory mode. In one embodiment, the frequency of refresh operations at rate2 of the performance read non-volatile memory mode is within a range of 10 to 100 times more frequent than the first frequency of refresh operations. For example, in a phase change non-volatile memory, a refresh operation may be applied once every two days in the default read non-volatile memory mode to preserve the non-volatile memory states of the bitcells. By comparison a refresh operation may be applied once every 4-5 hours, for example, in the performance read non-volatile memory mode to preserve the non-volatile memory states of the bitcells. It is appreciated that other rates of refresh operations may be applied in the various performance level modes of operation, depending upon the particular application. For example, a refresh operation may be applied once every day in the default read non-volatile memory mode to preserve the non-volatile memory states of the bitcells, and a refresh operation may be applied once every hour, for example, in the performance read non-volatile memory mode to preserve the non-volatile memory states of the bitcells.

In another aspect, a command received by the command logic 134 may include a parameter which identifies a selected refresh rate, such as the default level refresh rate1 (FIG. 5) or the performance level refresh rate2, for example. Thus, the multi-refresh rate selection logic 174 may be configured to select a refresh rate as identified by a refresh rate selection parameter accompanying a command received by the command logic 134. The refresh rate selection parameter identifying the selected refresh rate may be stored in a suitable data structure 138 of the command logic 134 in some embodiments.

In still another aspect, a command received by the command logic 134 may include a variable refresh rate value which quantifies a refresh rate. For example, the variable refresh rate value may be numerical in nature and identify a refresh rate as a function of the numerical value. For example, the identified refresh rate may be proportional to the magnitude of the variable refresh rate value.

The multi-refresh rate selection logic 174 accordingly may be further configured to program the rate of refresh operations as a function of the received refresh rate value to provide a programmable refresh rate. As a result, in one embodiment, the non-volatile memory modes may be programmable non-volatile memory modes in which persistence in each programmable non-volatile memory mode is programmable, as a function of a programmable read pulse width and a refresh rate in each programmable non-volatile memory mode is programmable. The refresh rate value of a received command may be stored in a suitable data structure 138 of the command logic 134.

FIG. 5 depicts for each read non-volatile memory mode, an associated characteristic such as an associated read pulse width and an associated refresh rate. By selecting one characteristic, the remaining associated characteristics of a particular non-volatile memory mode may be automatically selected in one embodiment.

For example, in one embodiment, the read pulse width1 and read pulse width2 of the default read non-volatile memory mode and the performance read non-volatile memory mode, respectively of FIG. 5 may be predetermined such that by selecting a particular read non-volatile memory mode, the associated read pulse width is automatically selected as a function of the selected read non-volatile memory mode. For example, by selecting the default read non-volatile memory mode, a predetermined value of the read pulse width1 is automatically selected. Similarly, by selecting the performance read non-volatile memory mode, a predetermined value of the read pulse width2 is automatically selected.

Similarly, in one embodiment, the refresh rate1 and refresh rate2 of the default read non-volatile memory mode and the performance read non-volatile memory mode, respectively of FIG. 5 may be predetermined such that by selecting a particular read non-volatile memory mode, the predetermined value of the associated refresh rate is automatically selected as a function of the selected read non-volatile memory mode. For example, by selecting the default read non-volatile memory mode, the predetermined value of the refresh rate1 is automatically selected. Similarly, by selecting the performance read non-volatile memory mode, the predetermined value of the refresh rate2 is automatically selected.

Conversely, in another embodiment, by selecting a predetermined read pulse width such as the read pulse width1, for example, the associated read non-volatile memory mode, the default read non-volatile memory mode in this example, may be automatically selected. Similarly, by selecting a predetermined read pulse width such as the read pulse width2, for example, the associated read non-volatile memory mode, the performance read non-volatile memory mode in this example, may be automatically selected.

Further, by selecting a predetermined read pulse width such as the read pulse width1, for example, an associated predetermined refresh rate, the refresh rate1 in this example, may be automatically selected. Similarly, by selecting a predetermined read pulse width such as the read pulse width2, for example, the associated predetermined refresh rate, the predetermined refresh rate2 in this example, may be automatically selected. Alternatively, one or more parameters such as read pulse width and refresh rate may be individually programmed in a particular programmable non-volatile memory mode.

As described above, FIG. 1 is a chart depicting an example of a trade-off between performance and non-volatile memory persistence in a system employing selective performance level modes of non-volatile memory operation in accordance with one embodiment of the present description. It is appreciated that reliability of the non-volatile memory is a function of changes in persistence and corresponding adjustments in refresh frequency to compensate for changes in persistence, Thus, if changes in persistence resulting from changes in read pulse width drift over time, changes in refresh rates may be correspondingly adjusted to maintain non-volatile memory reliability levels at each read non-volatile memory mode. Accordingly, in another aspect of the present description, the multi-read mode control logic 120 may be further configured to monitor and periodically assess reliability and performance (as a function of read pulse width) to ensure that the relationship between performance and non-volatile memory reliability remains constant with the same slopes, constants, and other parameters defining the relationship at the various read non-volatile memory modes.

Figure 7:
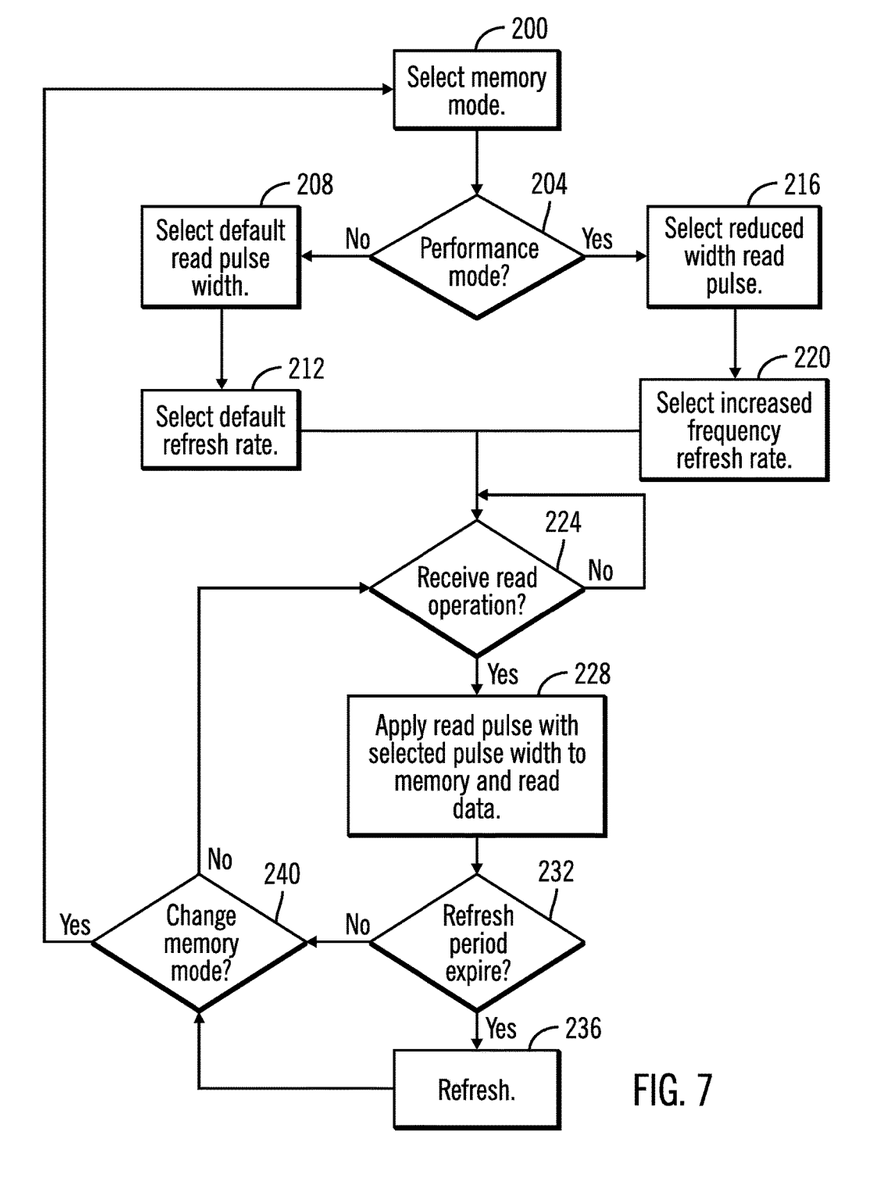
FIG. 7 depicts one embodiment of operations of a non-volatile memory controller in a system employing selective performance level modes of non-volatile memory operation in accordance with the present description.

Referring to FIGS. 4 and 7 unless otherwise noted, FIG. 7 depicts one example of operations of the multi-read mode control logic 120 (FIG. 4) of the non-volatile memory interface 100. In one operation, the multi-read mode selection logic 122 selects (block 200) a non-volatile memory mode as described above. In this example, one of two non-volatile memory modes may be selected, that is, a default read non-volatile memory mode having a default level of performance, and a performance read non-volatile memory mode having a higher level of performance than the default read non-volatile memory mode. A determination (block 204) is made as to whether the performance read non-volatile memory mode was selected. If not, it is determined (block 204) that the default read non-volatile memory mode was selected and accordingly, the default read pulse width (width1 (FIG. 5) in this example) is selected (block 208) by the multi-pulse width selection logic 130 as described above. Further, the default refresh rate (rate1 (FIG. 5) in this example), is selected (block 212) by the multi-refresh rate selection logic 174 as described above.

Conversely, if it is determined (block 204) that the performance read non-volatile memory mode was selected, the performance level read pulse width (width2 (FIG. 5) in this example) is selected (block 216) by the multi-pulse width selection logic 130 as described above. Because the performance level read pulse width2 (FIG. 5) of the performance read non-volatile memory mode is of shorter duration than the default level read pulse width1 (FIG. 5) of the default read non-volatile memory mode, the read latency of the performance read non-volatile memory mode will be of shorter duration in the performance read non-volatile memory mode leading to a reduced delay2 (FIG. 5) between read operations and a corresponding higher level of performance of the non-volatile memory.

As previously noted, a read pulse of reduced duration may cause the persistence of the non-volatile memory to be reduced as well. Accordingly, the performance level refresh rate (rate2 (FIG. 5) in this example), is selected (block 220) by the multi-refresh rate selection logic 174 as described above.

In another operation, a determination (block 224) is made as to whether a read operation has been received to be executed by the multi-read mode control logic 120 in the selected (block 220) read non-volatile memory operation mode. If so, read logic 170 applies (block 228) a read pulse having the selected (block 208, 216) read pulse width, to one or more bitcells of the non-volatile memory, to read (block 228) the non-volatile memory states stored in the bitcells being addressed. It is appreciated that a non-volatile memory state in the performance read non-volatile memory mode may have a persistence level which is shorter in duration than a non-volatile memory state in the default read non-volatile memory mode due to the shorter duration pulse width of a read pulse in the performance read non-volatile memory mode as compared to that of a read pulse in the default read non-volatile memory mode.

Accordingly, a determination (block 232) is made as to whether the refresh period of the selected (block 212, 220) refresh rate has expired. If so, a refresh operation is applied (block 236) to maintain the bit state values stored in the bitcells. Conversely, if it is determined (block 232) that the refresh period of the selected refresh rate has not expired, a refresh operation may be bypassed.

As previously mentioned, in one embodiment, the frequency of refresh operations at rate2 (FIG. 5) of the performance read non-volatile memory mode is within a range of 10 to 100 times more frequent than the first frequency of refresh operations. For example, in a phase change non-volatile memory, a refresh operation may be applied once every two days in the default read non-volatile memory mode to preserve the non-volatile memory states of the bitcells. By comparison a refresh operation may be applied once every 4-5 hours, for example in the performance read non-volatile memory mode to preserve the non-volatile memory states of the bitcells. It is appreciated that other rates of refresh operations may be applied in the various performance level modes of operation, depending upon the particular application.

A determination (block 240) is made as to whether the non-volatile memory mode of operation is to be changed such as from the default read non-volatile memory mode to the performance read non-volatile memory mode, or vice versa, for example. If so, the new non-volatile memory mode may be selected (block 200) as described above. Conversely, if the non-volatile memory mode is to remain unchanged, the multi-read mode control logic 120 continues to receive (block 224) additional read operations in the selected non-volatile memory mode.

It is appreciated that the operations depicted in the figures may be performed by non-volatile memory interface logic having selective performance level modes of non-volatile memory operation utilizing architectures other than that depicted in the figures and employing other types of logic components. The logic components discussed herein including the logic elements depicted in figures may be configured to perform the described operations using appropriate hardware, software or firmware, or various combinations thereof. The software may be in the form of firmware, programs, drivers and other instruction sets, and the hardware may be in the form of general purpose logic devices such as microprocessors or specific purpose logic devices such as a memory controller, DMA controller or engine or ASIC device, for example.

The hardware, software or firmware for devices employing selective performance level modes of non-volatile memory operation in accordance with the present description, may be physically or logically located in any component of the system including the non-volatile memory itself, a controller such as a non-volatile memory controller, DMA controller, a microprocessor, etc. Thus, in one embodiment, one or more of the memory interface logic elements depicted in the figures, may be implemented with one or more of hardware of a memory controller, firmware for a memory controller, and software such as associated driver software of a memory controller. In another embodiment, one or more of the memory interface logic elements depicted in the figures may be implemented with one or more of controller hardware such as the central processing unit, for example, or other controller, firmware for the controller hardware and software for the controller hardware such as programs and drivers executed by the controller hardware such as a central processing unit for example. In another embodiment, one or more of the memory interface logic elements depicted in the figures may be implemented with hardware, firmware or software for both an offload data transfer engine and a central processing unit, for example.

It is appreciated that a devices employing selective performance level modes of memory operation in accordance with the present description can, depending upon the particular application, improve system performance. Other aspects may be achieved, depending upon the particular application.

EXAMPLES

The following examples pertain to further embodiments.
Example 1 is an apparatus, for use with a processor and a non-volatile memory having a bitcell, the apparatus comprising:

a multi-read mode memory controller configured to control the non-volatile memory in a selectable read mode in response to commands from the processor, said memory controller including:
multi-read mode selection logic configured to select a memory mode from a plurality of memory modes including a first memory mode, and a second memory mode,
multi-pulse width selection logic configured to select a read pulse width from a plurality of widths in association with the selected memory mode, said plurality of widths including a first read pulse width having a first read latency in the first memory mode, and a second read pulse width having a second read latency in the second read mode, wherein the second read pulse width is shorter than the first read pulse width, and the second read latency is shorter than the first read latency, and
read logic configured to apply in a read operation in a selected memory mode, a read pulse having a selected read pulse width, to a bitcell of the non-volatile memory, to read a memory state stored in the bitcell wherein a memory state in the second read mode has a shorter persistence level than a memory state in the first read mode.

In Example 2, the subject matter of Examples 1-10 (excluding the present Example) can optionally include wherein the non-volatile memory controller further comprises:
multi-refresh rate selection logic configured to select a refresh rate from a plurality of refresh rates as a function of one of the selected memory mode and the selected read pulse width, wherein the plurality of refresh rates include a first refresh rate at a first frequency in the first memory mode, and a second refresh rate at a second frequency in the second memory mode wherein the frequency of the second refresh rate is more frequent than the frequency of the first refresh rate, and
refresh logic configured to apply in a selected memory mode, memory refresh operations to the non-volatile memory at a selected refresh rate of the selected memory mode.

In Example 3, the subject matter of Examples 1-10 (excluding the present Example) can optionally include wherein the second frequency of refresh operations is within a range of 10-100 times more frequent than the first frequency of refresh operations.

In Example 4, the subject matter of Examples 1-10 (excluding the present Example) can optionally include wherein the non-volatile memory controller further comprises:
command logic configured to receive a command from the processor, wherein the multi-read mode selection logic is further configured to select a memory mode in response to a command received by the command logic.

In Example 5, the subject matter of Examples 1-10 (excluding the present Example) can optionally include wherein the multi-pulse width selection logic is further configured to select a read pulse width in response to a command received by the command logic.

In Example 6, the subject matter of Examples 1-10 (excluding the present Example) can optionally include wherein the command logic is further configured to receive a variable read pulse width value, and wherein the multi-pulse width selection logic is further configured to program the width of a read pulse as a function of the received read pulse width value to provide a programmable read pulse width so that the first and second memory modes are programmable memory modes in which read latency in each programmable memory mode is programmable, as a function of a programmable read pulse width.

In Example 7, the subject matter of Examples 1-10 (excluding the present Example) can optionally include wherein the command logic is further configured to receive a variable refresh rate value, and wherein the multi-refresh rate selection logic is further configured to program a refresh rate as a function of the received refresh rate value so that the first and second memory modes are programmable memory modes in which persistence level in each programmable memory mode is programmable, as a function of a programmable read pulse width.

In Example 8, the subject matter of Examples 1-10 (excluding the present Example) can optionally include wherein the non-volatile memory is a phase change memory having a variable persistence level as a function of a variable read pulse width.

In Example 9, the subject matter of Examples 1-10 (excluding the present Example) can optionally include a system, said system comprising:
a central processing unit,
a non-volatile memory having a bitcell, and
said multi-read mode memory controller.

In Example 10, the subject matter of Examples 1-10 (excluding the present Example) can optionally include at least one of:
a display communicatively coupled to the data transfer logic, a network interface communicatively coupled to the data transfer logic, and a battery coupled to provide power to the system.

Example 11 is a method, comprising:
controlling a non-volatile memory in a selectable read mode in response to commands from a processor, said controlling including:
selecting a memory mode from a plurality of memory modes including a first memory mode, and a second memory mode,
selecting a read pulse width from a plurality of widths in association with the selected memory mode, said plurality of widths including a first read pulse width having a first read latency in the first memory mode, and a second read pulse width having a second read latency in the second read mode, wherein the second read pulse width is shorter than the first read pulse width, and the second read latency is shorter than the first read latency, and
applying in a read operation in a selected memory mode, a read pulse having a selected read pulse width, to a bitcell of the non-volatile memory, to read a memory state stored in the bitcell wherein a memory state in the second read mode has a shorter persistence level than a memory state in the first read mode.

In Example 12, the subject matter of Examples 1-18 (excluding the present Example) can optionally include wherein the controlling further comprises:
selecting a refresh rate from a plurality of refresh rates as a function of one of the selected memory mode and the selected read pulse width, wherein the plurality of refresh rates include a first refresh rate at a first frequency in the first memory mode, and a second refresh rate at a second frequency in the second memory mode wherein the frequency of the second refresh rate is more frequent than the frequency of the first refresh rate, and
applying in a selected memory mode, memory refresh operations to the non-volatile memory at a selected refresh rate of the selected memory mode.

In Example 13, the subject matter of Examples 1-18 (excluding the present Example) can optionally include wherein the second frequency of refresh operations is within a range of 10-100 times more frequent than the first frequency of refresh operations.

In Example 14, the subject matter of Examples 1-18 (excluding the present Example) can optionally include wherein selecting a memory mode comprises:
receiving a memory mode command from the processor, and selecting a memory mode in response to a received memory mode command.

In Example 15, the subject matter of Examples 1-18 (excluding the present Example) can optionally include wherein selecting a read pulse width includes receiving a read pulse width command from the processor and selecting a read pulse width in response to a received read pulse width command.

In Example 16, the subject matter of Examples 1-18 (excluding the present Example) can optionally include wherein the received read pulse width command includes a variable read pulse value, and wherein the selecting a read pulse width in response to a received read pulse width command includes programming the width of a read pulse as a function of the received read pulse width value to provide a programmable read pulse width so that the first and second memory modes are programmable memory modes in which read latency in each programmable memory mode is programmable, as a function of a programmable read pulse width.

In Example 17, the subject matter of Examples 1-18 (excluding the present Example) can optionally include wherein the selecting a refresh rate includes receiving a refresh rate command from the processor, which includes a variable refresh rate value, and in response to the received refresh rate command, programming a refresh rate as a function of the received refresh rate value so that the first and second memory modes are programmable memory modes in which persistence level in each programmable memory mode is programmable, as a function of a programmable read pulse width.

In Example 18, the subject matter of Examples 1-18 (excluding the present Example) can optionally include wherein the non-volatile memory is a phase change memory having a variable persistence level as a function of a variable read pulse width.

Example 19 is an apparatus comprising means to perform a method as claimed in any preceding claim.

Example 20 is an apparatus for use with a processor and a non-volatile memory having a bitcell, the apparatus comprising:
a multi-read mode memory controller means for controlling the non-volatile memory in a selectable read mode in response to commands from the processor, said memory controller means including:
multi-read mode selection means for selecting a memory mode from a plurality of memory modes including a first memory mode, and a second memory mode,
multi-pulse width selection means for selecting a read pulse width from a plurality of widths in association with the selected memory mode, said plurality of widths including a first read pulse width having a first read latency in the first memory mode, and a second read pulse width having a second read latency in the second read mode, wherein the second read pulse width is shorter than the first read pulse width, and the second read latency is shorter than the first read latency, and
read means for applying in a read operation in a selected memory mode, a read pulse having a selected read pulse width, to a bitcell of the non-volatile memory, to read a memory state stored in the bitcell wherein a memory state in the second read mode has a shorter persistence level than a memory state in the first read mode.

In Example 21, the subject matter of Examples 20-29 (excluding the present Example) can optionally include wherein the non-volatile memory controller means further comprises:

multi-refresh rate selection means for selecting a refresh rate from a plurality of refresh rates as a function of one of the selected memory mode and the selected read pulse width, wherein the plurality of refresh rates include a first refresh rate at a first frequency in the first memory mode, and a second refresh rate at a second frequency in the second memory mode wherein the frequency of the second refresh rate is more frequent than the frequency of the first refresh rate, and refresh means for applying in a selected memory mode, memory refresh operations to the non-volatile memory at a selected refresh rate of the selected memory mode.

In Example 22, the subject matter of Examples 20-29 (excluding the present Example) can optionally include wherein the second frequency of refresh operations is within a range of 10-100 times more frequent than the first frequency of refresh operations.

In Example 23, the subject matter of Examples 20-29 (excluding the present Example) can optionally include wherein the non-volatile memory controller means further comprises:

command means for receiving a command from the processor, wherein the multi-read mode selection means is further configured for selecting a memory mode in response to a command received by the command means.

In Example 24, the subject matter of Examples 20-29 (excluding the present Example) can optionally include wherein the multi-pulse width selection means is further configured for selecting a read pulse width in response to a command received by the command means.

In Example 25, the subject matter of Examples 20-29 (excluding the present Example) can optionally include wherein the command means is further configured for receiving a variable read pulse width value, and wherein the multi-pulse width selection means is further configured for programming the width of a read pulse as a function of the received read pulse width value to provide a programmable read pulse width so that the first and second memory modes are programmable memory modes in which read latency in each programmable memory mode is programmable, as a function of a programmable read pulse width.

In Example 26, the subject matter of Examples 20-29 (excluding the present Example) can optionally include wherein the command means is further configured for receiving a variable refresh rate value, and wherein the multi-refresh rate selection means is further configured for programming a refresh rate as a function of the received refresh rate value so that the first and second memory modes are programmable memory modes in which persistence level in each programmable memory mode is programmable, as a function of a programmable read pulse width.

In Example 27, the subject matter of Examples 20-29 (excluding the present Example) can optionally include wherein the non-volatile memory is a phase change memory having a variable persistence level as a function of a variable read pulse width.

In Example 28, the subject matter of Examples 20-29 (excluding the present Example) can optionally include a system, said system comprising:

a central processing unit, a non-volatile memory having a bitcell, and said multi-read mode memory controller.

In Example 29, the subject matter of Examples 20-29 (excluding the present Example) can optionally include at least one of:

a display communicatively coupled to the data transfer logic, a network interface communicatively coupled to the data transfer logic, and a battery coupled to provide power to the system.

Example 30 is a computer program product for a computing system wherein the computer program product comprises a computer readable storage medium having program instructions embodied therewith, the program instructions executable by a processor of the computing system to cause operations, the operations comprising controlling a non-volatile memory in a selectable read mode in response to commands from a processor, said controlling including:

selecting a memory mode from a plurality of memory modes including a first memory mode, and a second memory mode;

selecting a read pulse width from a plurality of widths in association with the selected memory mode, said plurality of widths including a first read pulse width having a first read latency in the first memory mode, and a second read pulse width having a second read latency in the second read mode, wherein the second read pulse width is shorter than the first read pulse width, and the second read latency is shorter than the first read latency; and applying in a read operation in a selected memory mode, a read pulse having a selected read pulse width, to a bitcell of the non-volatile memory, to read a memory state stored in the bitcell wherein a memory state in the second read mode has a shorter persistence level than a memory state in the first read mode.

In Example 31, the subject matter of Examples 30-37 (excluding the present Example) can optionally include wherein the controlling further comprises:

selecting a refresh rate from a plurality of refresh rates as a function of one of the selected memory mode and the selected read pulse width, wherein the plurality of refresh rates include a first refresh rate at a first frequency in the first memory mode, and a second refresh rate at a second frequency in the second memory mode wherein the frequency of the second refresh rate is more frequent than the frequency of the first refresh rate; and applying in a selected memory mode, memory refresh operations to the non-volatile memory at a selected refresh rate of the selected memory mode.

In Example 32, the subject matter of Examples 30-37 (excluding the present Example) can optionally include wherein the second frequency of refresh operations is within a range of 10-100 times more frequent than the first frequency of refresh operations.

In Example 33, the subject matter of Examples 30-37 (excluding the present Example) can optionally include wherein selecting a memory mode comprises:

receiving a memory mode command from a processor, and selecting a memory mode in response to a received memory mode command.

In Example 34, the subject matter of Examples 30-37 (excluding the present Example) can optionally include wherein selecting a read pulse width includes receiving a read pulse width command from a processor and selecting a read pulse width in response to a received read pulse width command.

In Example 35, the subject matter of Examples 30-37 (excluding the present Example) can optionally include, wherein the received read pulse width command includes a variable read pulse value, and wherein the selecting a read pulse width in response to a received read pulse width command includes programming the width of a read pulse as a function of the received read pulse width value to provide a programmable read pulse width so that the first and second memory modes are programmable memory modes in which read latency in each programmable memory mode is programmable, as a function of a programmable read pulse width.

In Example 36, the subject matter of Examples 30-37 (excluding the present Example) can optionally include, wherein the selecting a refresh rate includes receiving a refresh rate command from a processor, which includes a variable refresh rate value, and in response to the received refresh rate command, programming a refresh rate as a function of the received refresh rate value so that the first and second memory modes are programmable memory modes in which persistence level in each programmable memory mode is programmable, as a function of a programmable read pulse width.

In Example 37, the subject matter of Examples 30-37 (excluding the present Example) can optionally include wherein the non-volatile memory is a phase change memory having a variable persistence level as a function of a variable read pulse width.

The described operations may be implemented as a method, apparatus or computer program product using standard programming and/or engineering techniques to produce software, firmware, hardware, or any combination thereof. The described operations may be implemented as computer program code maintained in a "computer readable storage medium", where a processor may read and execute the code from the computer storage readable medium. The computer readable storage medium includes at least one of electronic circuitry, storage materials, inorganic materials, organic materials, biological materials, a casing, a housing, a coating, and hardware. A computer readable storage medium may comprise, but is not limited to, a magnetic storage medium (e.g., hard disk drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs, Flash Memory, firmware, programmable logic, etc.), Solid State Devices (SSD), etc. The code implementing the described operations may further be implemented in hardware logic implemented in a hardware device (e.g., an integrated circuit chip, Programmable Gate Array (PGA), Application Specific Integrated Circuit (ASIC), etc.). Still further, the code implementing the described operations may be implemented in "transmission signals", where transmission signals may propagate through space or through a transmission media, such as an optical fiber, copper wire, etc. The transmission signals in which the code or logic is encoded may further comprise a wireless signal, satellite transmission, radio waves, infrared signals, Bluetooth, etc. The program code embedded on a computer readable storage medium may be transmitted as transmission signals from a transmitting station or computer to a receiving station or computer. A computer readable storage medium is not comprised solely of transmissions signals. Those skilled in the art will recognize that many modifications may be made to this configuration without departing from the scope of the present description, and that the article of manufacture may comprise suitable information bearing medium known in the art.

Of course, those skilled in the art will recognize that many modifications may be made to this configuration without departing from the scope of the present description, and that the article of manufacture may comprise any tangible information bearing medium known in the art.

In certain applications, a device in accordance with the present description, may be embodied in a computer system including a video controller to render information to display on a monitor or other display coupled to the computer system, a device driver and a network controller, such as a computer system comprising a desktop, workstation, server, mainframe, laptop, handheld computer, etc. Alternatively, the device embodiments may be embodied in a computing device that does not include, for example, a video controller, such as a switch, router, etc., or does not include a network controller, for example.

The illustrated logic of figures may show certain events occurring in a certain order. In alternative embodiments, certain operations may be performed in a different order, modified or removed. Moreover, operations may be added to the above described logic and still conform to the described embodiments. Further, operations described herein may occur sequentially or certain operations may be processed in parallel. Yet further, operations may be performed by a single processing unit or by distributed processing units.

The foregoing description of various embodiments has been presented for the purposes of illustration and description. It is not intended to be exhaustive or to limit to the precise form disclosed. Many modifications and variations are possible in light of the above teaching.

What is claimed is:

1. An apparatus for use with a processor and a non-volatile memory having a bitcell, the apparatus comprising:
   a multi-read mode memory controller configured to control the non-volatile memory in a selectable read mode in response to commands from the processor, said memory controller including:
   multi-read mode selection logic configured to select a memory mode from a plurality of memory modes including a first memory mode, and a second memory mode;
   multi-pulse width selection logic configured to select a read pulse width from a plurality of widths in association with the selected memory mode, said plurality of widths including a first read pulse width having a first read latency in the first memory mode, and a second read pulse width having a second read latency in the second read mode, wherein the second read pulse width is shorter than the first read pulse width, and the second read latency is shorter than the first read latency;
   read logic configured to apply in a read operation in a selected memory mode, a read pulse having a selected read pulse width, to a bitcell of the non-volatile memory, to read a memory state stored in the bitcell wherein a memory state in the second read mode has a shorter persistence level than a memory state in the first read mode;
   multi-refresh rate selection logic configured to select a refresh rate from a plurality of refresh rates as a function of one of the selected memory mode and the selected read pulse width, wherein the plurality of refresh rates include a first refresh rate at a first frequency in the first memory mode, and a second refresh rate at a second frequency in the second memory mode wherein the frequency of the second refresh rate is more frequent than the frequency of the first refresh rate; and refresh logic configured to apply in a selected memory mode, memory refresh operations to the non-volatile memory at a selected refresh rate of the selected memory mode.

2. The apparatus of claim 1 wherein the second frequency of refresh operations is within a range of 10-100 times more frequent than the first frequency of refresh operations.

3. The apparatus of claim 1, wherein the memory controller further comprises:
command logic configured to receive a command from the processor, wherein the multi-read mode selection logic is further configured to select a memory mode in response to a command received by the command logic.

4. The apparatus of claim 3, wherein the multi-pulse width selection logic is further configured to select a read pulse width in response to a command received by the command logic.

5. The apparatus of claim 4, wherein the command logic is further configured to receive a variable read pulse width value, and wherein the multi-pulse width selection logic is further configured to program the width of a read pulse as a function of the received variable read pulse width value to provide a programmable read pulse width so that the first and second memory modes are programmable memory modes in which read latency in each programmable memory mode is programmable, as a function of a programmable read pulse width.

6. The apparatus of claim 3, wherein the command logic is further configured to receive a variable refresh rate value, and wherein the multi-refresh rate selection logic is further configured to program a refresh rate as a function of the received variable refresh rate value so that the first and second memory modes are programmable memory modes in which persistence level in each programmable memory mode is programmable, as a function of a programmable read pulse width.

7. The apparatus of claim 6 wherein the non-volatile memory is a phase change memory having a variable persistence level as a function of a variable read pulse width.

8. A method, comprising:
controlling a non-volatile memory in a selectable read mode in response to commands from a processor, said controlling including:
selecting a memory mode from a plurality of memory modes including a first memory mode, and a second memory mode;
selecting a read pulse width from a plurality of widths in association with the selected memory mode, said plurality of widths including a first read pulse width having a first read latency in the first memory mode, and a second read pulse width having a second read latency in the second read mode, wherein the second read pulse width is shorter than the first read pulse width, and the second read latency is shorter than the first read latency;
applying in a read operation in a selected memory mode, a read pulse having a selected read pulse width, to a bitcell of the non-volatile memory, to read a memory state stored in the bitcell wherein a memory state in the second read mode has a shorter persistence level than a memory state in the first read mode;
selecting a refresh rate from a plurality of refresh rates as a function of one of the selected memory mode and the selected read pulse width, wherein the plurality of refresh rates include a first refresh rate at a first frequency in the first memory mode, and a second refresh rate at a second frequency in the second memory mode wherein the frequency of the second refresh rate is more frequent than the frequency of the first refresh rate; and
applying in a selected memory mode, memory refresh operations to the non-volatile memory at a selected refresh rate of the selected memory mode.

9. The method of claim 8 wherein the second frequency of refresh operations is within a range of 10-100 times more frequent than the first frequency of refresh operations.

10. The method of claim 8, wherein selecting a memory mode comprises:
receiving a memory mode command from the processor, and selecting a memory mode in response to a received memory mode command.

11. The method of claim 10, wherein selecting a read pulse width includes receiving a read pulse width command from the processor and selecting a read pulse width in response to a received read pulse width command.

12. The method of claim 11, wherein the received read pulse width command includes a variable read pulse width value, and wherein the selecting a read pulse width in response to a received variable read pulse width command includes programming the width of a read pulse as a function of the received read pulse width value to provide a programmable read pulse width so that the first and second memory modes are programmable memory modes in which read latency in each programmable memory mode is programmable, as a function of a programmable read pulse width.

13. The method of claim 8, wherein the selecting a refresh rate includes receiving a refresh rate command from the processor, which includes a variable refresh rate value, and in response to the received refresh rate command, programming a refresh rate as a function of the received variable refresh rate value so that the first and second memory modes are programmable memory modes in which persistence level in each programmable memory mode is programmable, as a function of a programmable read pulse width.

14. The method of claim 13 wherein the non-volatile memory is a phase change memory having a variable persistence level as a function of a variable read pulse width.

15. A system comprising:
a processor;
a non-volatile memory having a bitcell; and
a multi-read mode memory controller configured to control the non-volatile memory in a selectable read mode in response to commands from the processor, said memory controller including:
multi-read mode selection logic configured to select a memory mode from a plurality of memory modes including a first memory mode, and a second memory mode;
multi-pulse width selection logic configured to select a read pulse width from a plurality of widths in association with the selected memory mode, said plurality of widths including a first read pulse width having a first read latency in the first memory mode, and a second read pulse width having a second read latency in the second read mode, wherein the second read pulse width is shorter than the first read pulse width, and the second read latency is shorter than the first read latency;
read logic configured to apply in a read operation in a selected memory mode, a read pulse having a selected read pulse width, to a bitcell of the non-volatile memory, to read a memory state stored in the bitcell wherein a memory state in the second read mode has a shorter persistence level than a memory state in the first read mode;

multi-refresh rate selection logic configured to select a refresh rate from a plurality of refresh rates as a function of one of the selected memory mode and the selected read pulse width, wherein the plurality of refresh rates include a first refresh rate at a first frequency in the first memory mode, and a second refresh rate at a second frequency in the second memory mode wherein the frequency of the second refresh rate is more frequent than the frequency of the first refresh rate; and refresh logic configured to apply in a selected memory mode, memory refresh operations to the non-volatile memory at a selected refresh rate of the selected memory mode.

16. The system of claim 15 wherein the second frequency of refresh operations is within a range of 10-100 times more frequent than the first frequency of refresh operations.

17. The system of claim 15, wherein the memory controller further comprises:

command logic configured to receive a command from the processor, wherein the multi-read mode selection logic is further configured to select a memory mode in response to a command received by the command logic.

18. The system of claim 17, wherein the multi-pulse width selection logic is further configured to select a read pulse width in response to a command received by the command logic.

19. The system of claim 18, wherein the command logic is further configured to receive a variable read pulse width value, and wherein the multi-pulse width selection logic is further configured to program the width of a read pulse as a function of the received variable read pulse width value to provide a programmable read pulse width so that the first and second memory modes are programmable memory modes in which read latency in each programmable memory mode is programmable, as a function of a programmable read pulse width.

20. The system of claim 17, wherein the command logic is further configured to receive a variable refresh rate value, and wherein the multi-refresh rate selection logic is further configured to program a refresh rate as a function of the received variable refresh rate value so that the first and second memory modes are programmable memory modes in which persistence level in each programmable memory mode is programmable, as a function of a programmable read pulse width.

21. The system of claim 20 wherein the non-volatile memory is a phase change memory having a variable persistence level as a function of a variable read pulse width.

22. The system of claim 15 further comprising at least one of:

a display communicatively coupled to the processor, a network interface communicatively coupled to the processor, and a battery coupled to provide power to the system.

* * * * *